(12) United States Patent
Parker

(10) Patent No.: US 6,219,276 B1
(45) Date of Patent: Apr. 17, 2001

(54) MULTILEVEL CELL PROGRAMMING

(75) Inventor: Allan Parker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/513,643

(22) Filed: Feb. 25, 2000

(51) Int. Cl.⁷ .................................................. G11C 16/04
(52) U.S. Cl. .............................. 365/185.03; 365/185.19; 365/185.29
(58) Field of Search .................... 365/185.03, 185.29, 365/185.19, 185.17, 185.02, 185.33

(56) References Cited

U.S. PATENT DOCUMENTS

| | | | |
|---|---|---|---|
| 5,302,870 | 4/1994 | Chern | 307/530 |
| 5,429,968 | 7/1995 | Koyama | 437/48 |
| 5,457,650 | 10/1995 | Sugiura et al. | 365/184 |
| 5,523,972 | 6/1996 | Rashid et al. | 365/185.22 |
| 5,596,526 | 1/1997 | Assar et al. | 365/185.17 |
| 5,602,789 | 2/1997 | Endoh et al. | 365/201 |
| 5,689,679 | 11/1997 | Jouppi | 395/449 |
| 5,815,436 | 9/1998 | Tanaka et al. | 365/185.03 |
| 5,831,900 | 11/1998 | Miyamoto | 365/185.03 |
| 5,847,992 | 12/1998 | Tanaka et al. | 365/185.03 |
| 5,852,575 | 12/1998 | Sugiura et al. | 365/184 |
| 5,901,089 * | 5/1999 | Korsh et al. | 365/185.24 |
| 5,949,101 | 9/1999 | Aritome | 257/315 |
| 5,986,929 | 11/1999 | Sugiura et al. | 365/185.03 |
| 6,026,015 | 2/2000 | Hirakawa | 365/185.03 |
| 6,028,792 | 2/2000 | Tanaka et al. | 365/185.22 |
| 6,091,631 * | 7/2000 | Kucera et al. | 365/185.03 |
| 6,154,391 * | 5/1999 | Takeuchi et al. | 365/185.24 |

FOREIGN PATENT DOCUMENTS

WO 99/07000  2/1999  (WO).

* cited by examiner

Primary Examiner—Richard Elms
Assistant Examiner—Hien Nguyen
(74) Attorney, Agent, or Firm—Brinks Hofer Gilson & Lione

(57) ABSTRACT

Method of storing and retrieving multiple bits of information in a multi-level cell of non-volatile memory including programming a plurality of multi-level memory cells within a programming time target. The multi-level memory cells having at least first, second, third and fourth programming levels. The fourth programming level being the erase state, the first programming level being the programming level furthest from the fourth programming level. The second and third programming levels being within the first and fourth programming levels, includes erasing the plurality of multi-level memory cells. Then, programming a first group of multi-level memory cells with the first programming level with a first programming pulse count having a first pulse width and a first programming voltage. Then, programming a second group of multi-level memory cells with the second programming level with a second programming pulse count having a second pulse width and a second programming voltage. Then programming a third group of multi-level memory cells with the third programming level with a third programming pulse count having a third pulse width and a third programming voltage.

20 Claims, 5 Drawing Sheets

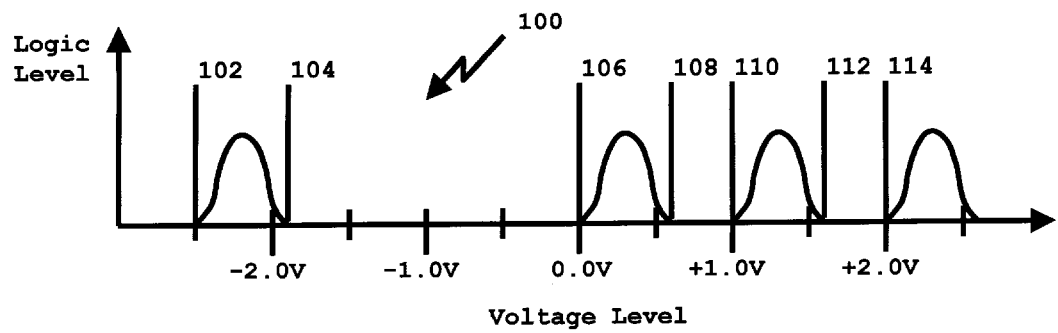
Figure 1 - Prior Art
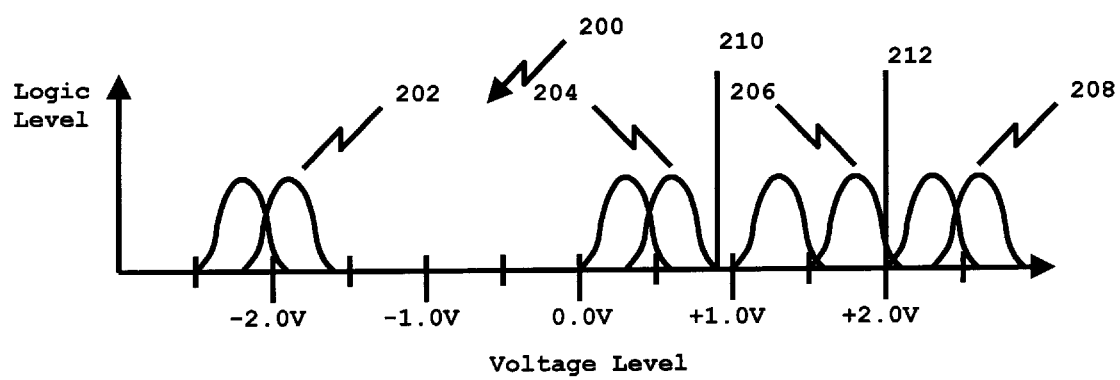
Figure 2 - Prior Art
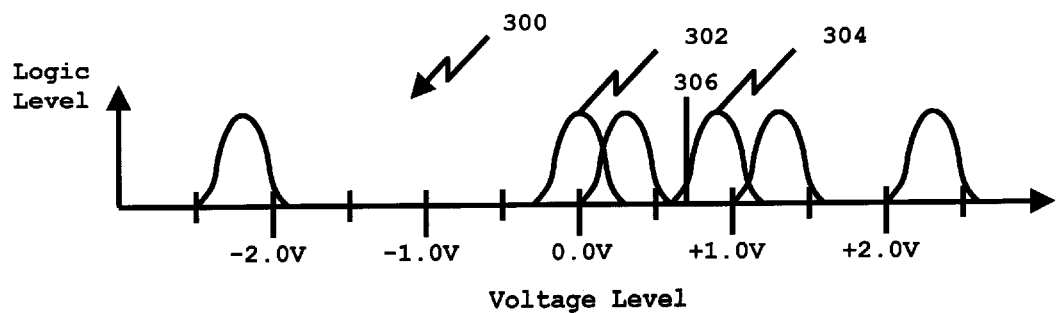
Figure 3 - Prior Art

MULTILEVEL CELL PROGRAMMING

RELATED APPLICATIONS

The following application is related by subject matter and is hereby incorporated by reference:

Application Ser. No. 09/511,874 to entitled "Variable Pulse Width Memory Programming."

BACKGROUND

A flash memory cell can be a field effect transistor (FET) that includes a select gate, a floating gate, a drain, and a source. A memory cell can be read by grounding the source, and applying a voltage to a bitline connected with the drain. By applying a voltage to the wordline connected to select gate, the cell can be switched on and off.

Programming a memory cell includes trapping excess electrons in the floating gate to increase voltage. This reduces the current conducted by the memory cell when the select voltage is applied to the select gate. The memory cell is programmed when the memory cell current is less than a reference current and the select voltage is applied. The memory cell is erased when the memory cell current is greater than the reference current and the select voltage is applied.

Memory cells with only two programmable states contain only a single bit of information, such as a "0" or a "1".

A multi-level cell ("MLC") can be programmed with more than one voltage level. Each voltage level is mapped to corresponding bits of information. For example, a multi-level cell is programmed with one of four voltage levels, −2.5V, 0.0V, +1.0V, +2.0V that correspond to binary "00", "01", "10", and "11", respectively. A cell that is programmable at more voltage levels can store more bits of data based on the following equation:

$$N=2^B \qquad \text{Eqn. 1}$$

B is the number of bits of data stored

N is the number of voltage levels.

Thus, a 1 bit cell requires 2 voltage levels, a 2 bit cell requires 4 voltage levels, a 3 bit cell requires 8 voltage levels, and a 4 bit cell requires 16 voltage levels.

Two of the primary data reliability issues for memory cells, particularly NAND flash, are the "data retention" effect and "read disturb" effect. The "data retention" effect is a shift in voltage that results from the normal passage of time. This shift is toward the erase state. The "read disturb" effect is a shift in the voltage that results from reading the memory cell. For the read disturb effect to be appreciable, many reads must occur. The read disturb effect and the data retention effect shift the voltage in opposite directions.

When the voltage level shifts too far in either direction, it will be interpreted as representing the next higher or lower voltage level and thus the data will be misread. To prevent such misreads, the "data retention" effect and "read disturb" effect should be optimized to minimize the voltage shifts.

FIG. 1 shows a representation of a four level multilevel cell program voltage diagram 100. The program voltage distribution ("distribution") of the four levels are shown between lines 102 and 104, 106 and 108, lines 110 and 112, and above line 114, respectively. The programming distribution can be for example 100 mV to 600 mV wide. A four level multilevel memory cell can be programmed with any one of these voltage levels. Because the cell can store one of four binary values it can store 2 bits of information. The data margin ("margin"), also called a guard band, is the voltage levels between distributions that is not normally used. The margins are shown in FIG. 1 between lines 104 and 106; lines 108 and 110; and lines 112 and 114. For example, the data margin can be 800 mV to 100 mV wide.

FIG. 2 shows the affect of the phenomena called "read disturb." Read disturb occurs after the cell has been read many times without being reprogrammed. The programming distributions are shifted to the right, which represents a positive voltage shift. Distributions 230, 232, 234, and 236 represent the distributions 220, 222, 224, and 226 after they have been affected by the read disturb. Eventually, the read disturb can become so severe that the stored data becomes unreliable, such as at lines 210 and 212.

FIG. 3 shows the affect of the phenomena called "data retention." Data retention causes the distributions 220, 222, 224, and 226 to be shifted to the left as shown by distributions 320, 322, 324, and 326, which represents a negative voltage shift. Over time if the cell is not reprogrammed, the data retention shift can cause the stored data to become unreliable.

BRIEF SUMMARY OF THE PREFERRED EMBODIMENTS

Method of storing and retrieving multiple bits of information in a multi-level cell of non-volatile memory including programming a plurality of multi-level memory cells within a programming time target. The multi-level memory cells having at least first, second, third and fourth programming levels. The fourth programming level being the erase state, the first programming level being the programming level furthest from the fourth programming level. The second and third programming levels being within the first and fourth programming levels, includes erasing the plurality of multi-level memory cells. Then, programming a first group of multi-level memory cells with the first programming level with a first programming pulse count having a first pulse width and a first programming voltage. Then, programming a second group of multi-level memory cells with the second programming level with a second programming pulse count having a second pulse width and a second programming voltage. Then programming a third group of multi-level memory cells with the third programming level with a third programming pulse count having a third pulse width and a third programming voltage.

BRIEF DESCRIPTION OF SEVERAL VIEWS OF THE DRAWINGS

The present invention is illustrated by way of example and not limitation in the accompanying figures. In the figures, like reference numbers indicate identical or functionally similar elements. Additionally, the left-most digit(s) of a reference number identifies the figure in which the reference number first appears.

FIG. 1 is a representation of the programmable voltage levels of a multi-level cell;

FIG. 2 is a representation of the programmable voltage levels of a multi-level cell with a positive voltage shift;

FIG. 3 is a representation of the programmable voltage levels of a multi-level cell with a negative voltage shift;

DETAILED DESCRIPTION OF THE PREFERRED EMBODIMENTS

Multi-bit memory cell programming can be optimized by programming cells based on the value to be stored rather than traditional serial programming. Because the voltage level and programming pulse count vary depending on which value is stored in a memory cell, traditional serial programming requires time to adjust for each memory cell. An example of an embodiment of the present invention applied to a two-bit memory cell is: programming all the memory cells that will have the binary value of "11", then programming the memory cells that will have the binary value of "10", then programming the memory cells that will have the binary value of "01." This is done on a page by page basis. A page typically has 1024 cells. The value of "00" does not need to be programmed because it is equivalent to the erase state. In this embodiment, the programming circuit will have to adjust the programming level and pulse count only three times rather than 1024 times.

Figure 4:
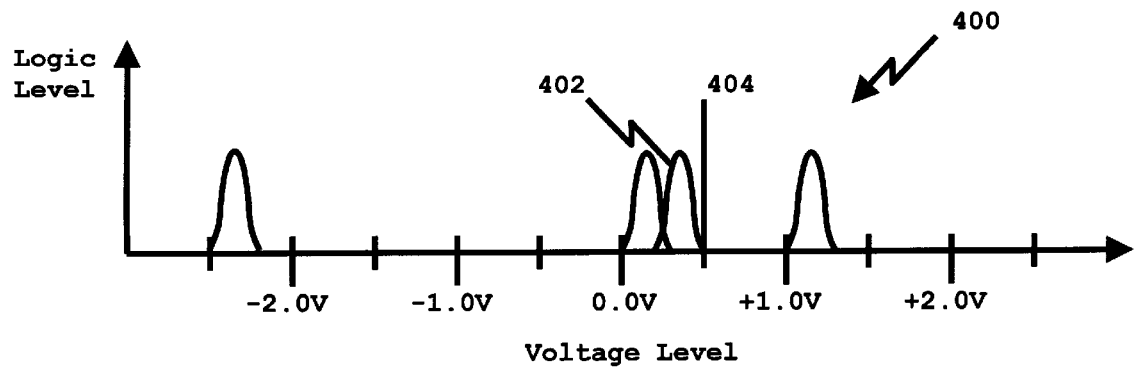
FIG. 4 is a representation of narrower programmable voltage levels of a multi-level cell with a positive voltage shift.
Figure 5:
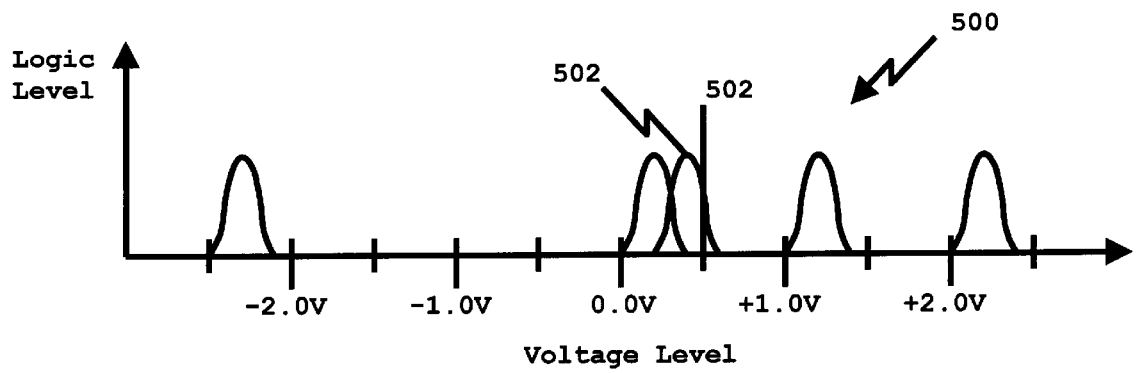
FIG. 5 is a representation of wider programmable voltage levels of a multi-level cell with a positive voltage shift.

Because the voltage levels of the stored data can shift to the left or the right as shown in FIGS. 2 and 3, it is beneficial to have narrower program distributions and thus wider program margins. FIGS. 4 and 5 illustrate this. FIG. 4 has program distributions of approximately 200 mV, while FIG. 5 has program distributions of 400 mV. If the program distributions 404 and 504 in FIG. 4 and 5 respectfully are shifted to the right by 100 mVs, the data distribution 406 in FIG. 4 will still be read properly at read point 402, while the data distribution 506 in FIG. 5 will be read incorrectly at read point 502. The read points 402 and 502 represent the threshold voltage value that separate the zero volt distribution from the one volt distributions. That is, if the voltage is above the read point the cell is read as the two bits associated with the one volt distribution and if the read voltage is below the read point then the cell is read as the two bits associated with the zero volt distribution.

While the narrower program distributions of FIG. 4 are more reliable than those of FIG. 5, to achieve the narrower program distributions require longer programming time. Programming time is the time required to program a cell to a voltage within a valid program distribution. A cell is programmed by applying one or more pulses at a voltage level. The voltage level of the pulses is often much higher then the voltage distribution. For example, to program a cell to the one volt distribution, 2 pulses at 20V can be used. However, to achieve a narrower program distribution, 20 pulses at 16V may be used. Thus, a fundamental trade off is made between programming speed and program margin.

Figure 6:
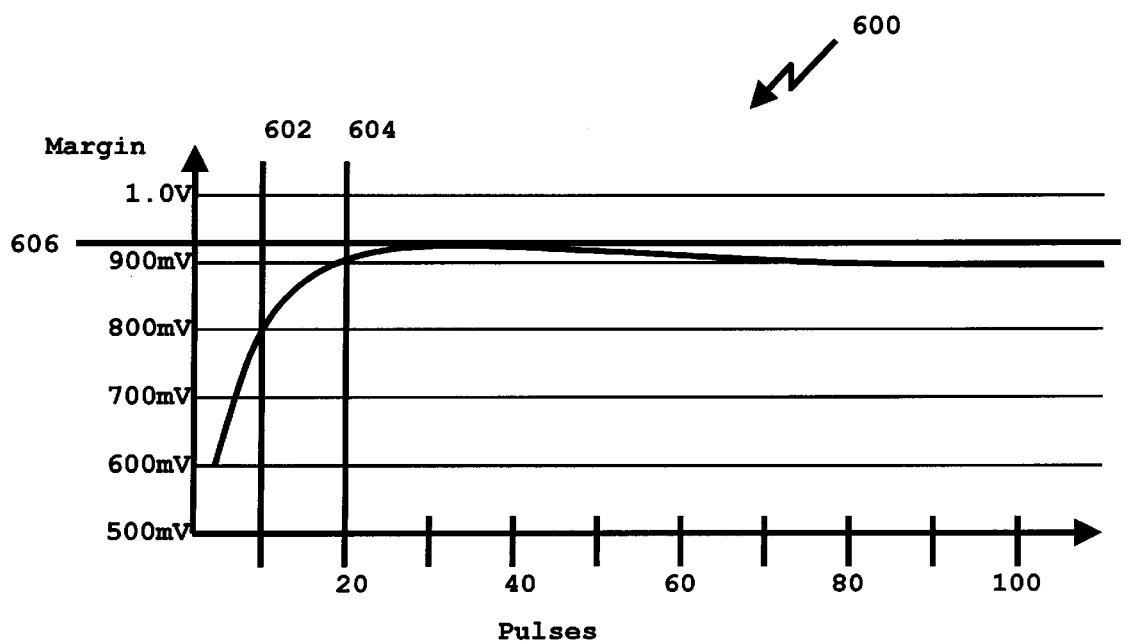
FIG. 6 is a representation of the voltage margin per pulse count.

FIG. 6 shows the relation of the programming pulse count to the data margin for a multi-level NAND flash cell. The maximum data margin is represented by line 606 and occurs between thirty and forty pulses. The data margin falls off slightly after forty pulses because of program disturb. Line 606 represents a data margin of approximately 940 mV, which is the maximum data margin. At line 602 ten pulses have programmed the cell to approximately 85% of the maximum data margin, approximately 800 mV. At line 604 twenty pulses have programmed the cell to approximately 95% of the maximum data margin, approximately 895 mV. The 85% and 95% points are significant, regardless of the memory cell type, for determining how many pulses should be used for optimizing between programming time and data margin.

Narrower program distributions can be accomplished by programming the cell with a series of pulses. The greater the number of pulses used to program the cell, the narrower the program distributions. However, as the number of pulses used to program a cell increases, the time required to program the cell also increases according to the following equation:

Program Time=Pulses×(Pulse width+Verify time)  Eqn. 2

For example, if 20 pulses with a width of 10 microseconds are used to program the cell, and a 4 microsecond verify time is requires, the time required to program the cell is 280 microseconds, (20×10 microseconds+20×4 microseconds).

Figure 7:
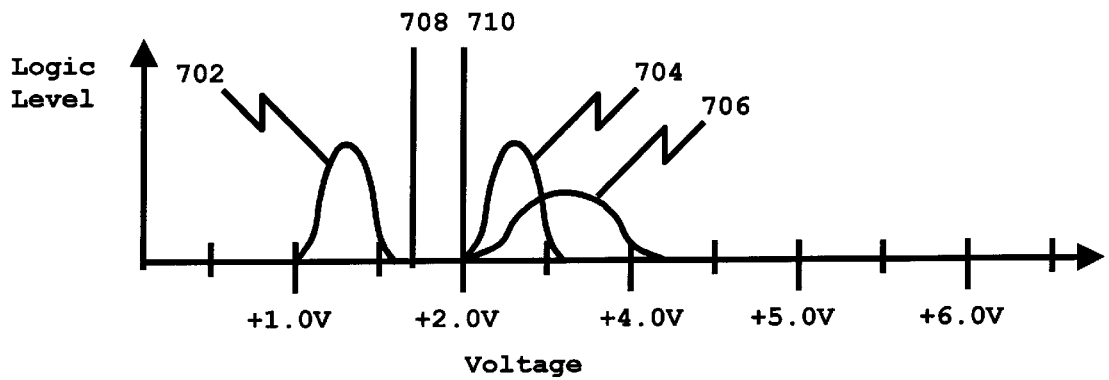
FIG. 7 is a representation of the programmable voltage levels of a multi-level cell with distributions created by 5 and 10 pulses.

FIG. 7 shows a diagram of programmable voltage levels of a multi-level cell. The IV program distribution 702 and the 2V program distribution 704 both correlate to programming with 10 pulses while the 2V program distribution 706 correlates to programming with only 5 pulses. The program distribution 706 (5 pulses) is shorted and wider than the program distribution 704 (20 pulses). Thus, the program distribution correlates positively with the pulse count and is not related to the program time. Thus, a cell that is programmed with twenty 18.0V pulses with 10 microsecond pulse width can have the same or similar program distribution as a cell that is programmed with twenty 18.5V pulses with 5 microsecond pulse width. However, the first cell would have a program time of 280 microseconds and the second cell would have a program time of only 180 microseconds.

Figure 8:
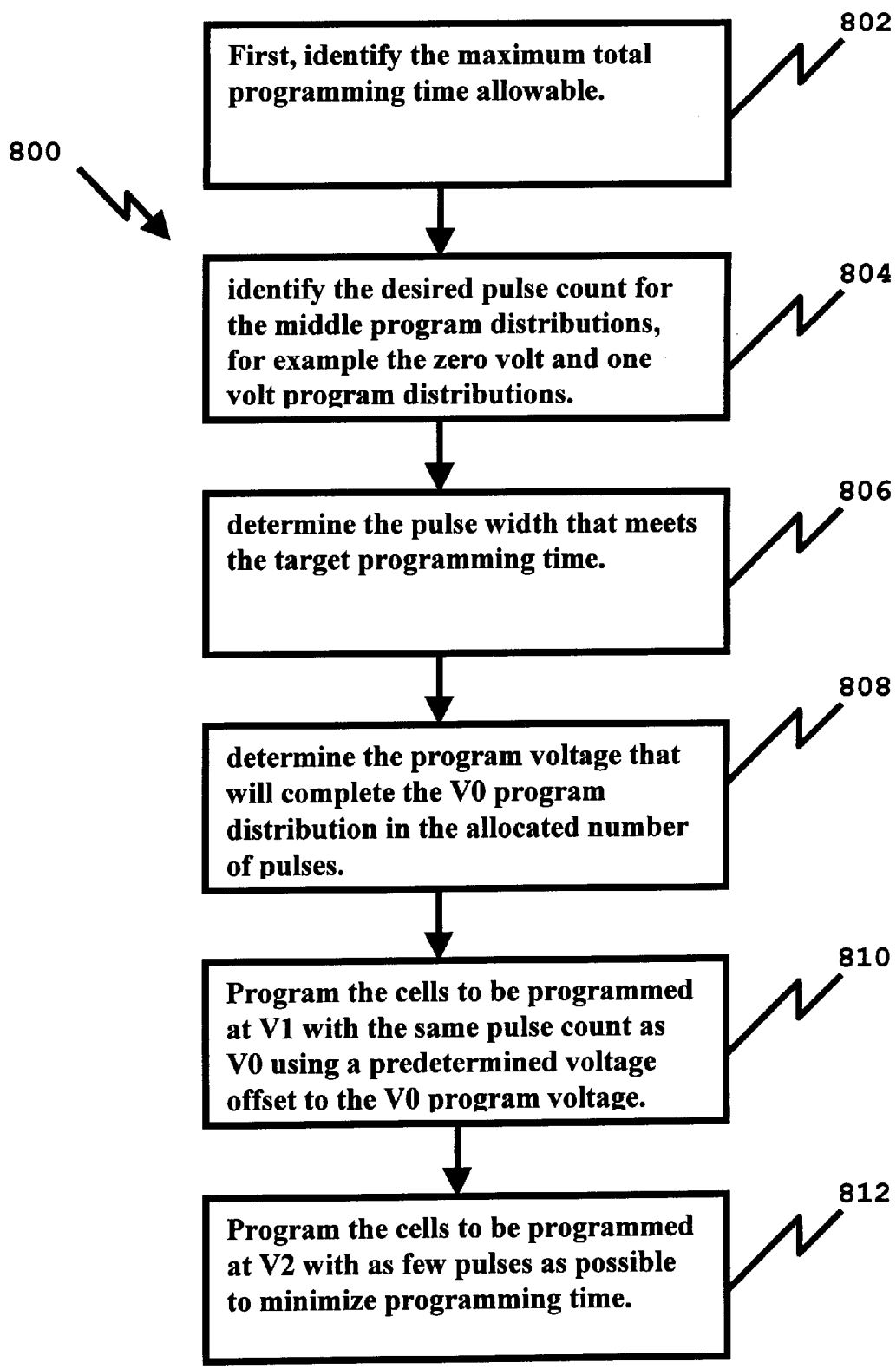
FIG. 8 is a flow diagram of an embodiment of the multi-level cell programming method.

In FIG. 8, a method 800 determines the optimal programming of a multi-level cell.

In 802, the maximum total programming time allowable is identified. This is the total time for programming all the cells at the three program distributions. For example, target program time is 300 microsecond. The fourth voltage level is the erase state, for example −2.5V, and does not need to be programmed because the page was erase before being programmed.

In 804, the desired pulse count for the middle program distributions is identified. For example the zero volt and one volt program distributions. From FIG. 6, a pulse count of approximately 10 achieves 85% of the maximum data margin. The pulse count may vary for different cells. However, it is desirable to achieve a data margin of at least 85% of the maximum data margin.

In 806, the pulse width that meets the target programming time is determined. For example, assuming "program verify" takes 5 microseconds and the two volt ("V2") program distribution is programmed in 5 microseconds, the middle program distributions will be programmed with 7.5 microseconds pulse width.

Programming Time=pulse count×(pulse width+verify time) Eqn. 3

Programming Time for V0=10×(7.5 $\mu$s+5 $\mu$s)=125 us

Programming Time for V1=10×(7.5 $\mu$S+5 $\mu$s)=125 us

Programming Time for V2=5×(5 $\mu$s+5 $\mu$s)=50 $\mu$s

Total time=Time for V0+Time for V1+Time for V2   Eqn. 4

=125 $\mu$s+125 $\mu$s+50 $\mu$s=300 $\mu$s

V0 is the zero volt program distribution, V1 is the one volt program distribution, and V2 is the two volt program distribution.

In 808, the program voltage that will complete the V0 program distribution in the allocated number of pulses is determined.

In 810, the cells to be programmed at V1 is programmed with the same pulse count as V0 using a predetermined voltage offset to the V0 program voltage. An analysis of the cell can determine this offset. The offset is constant from cell to cell regardless of number of cycles the cell has been used and fabrication variations between lots. Thus, a cell with faster programming at 17.5V requires the same offset as a cell with slower programming that has a V0 program voltage of 18.5V.

$$\text{Program Voltage (V1)} = \text{Program voltage (V0)} + \text{offset} \quad \text{Eqn. 5}$$
$$= 18.0V + 1.0V = 19.0V$$

In 812, the cells to be programmed at V2 are programmed with as few pulses as possible to minimize programming time. For example, 5 pulses. As shown in FIG. 7, the program distribution 702 represents V1 and the curves 704 and 706 represent V2 programmed with 10 and 5 pulses, respectively. Since the program margin, 708 to 710, is the same for both program distributions 704 and 706, program distribution 706 is used because it is programmed with only 5 pulses. The width of the V2 program distribution of V2 is not critical because no voltage distribution exist above the V2.

Traditionally, an array of cells is programmed sequentially regardless of the value to be programmed. In order to improve programming time, the order of programming is changed. All cells in the memory (array, page, or group) are set to the erase state, then all cells in the memory that are to be programmed with V2 are programmed first. By programming V2 first, the programming with the fewest number of pulses prevents this less accurate programming from interfering with the programming of VT0 and VT1. Then all the cells to be programmed with V1 are programmed with an initial voltage and the determined number of pulses. Finally, the cells to be programmed with V0 are programmed with the initial voltage plus an offset and the determined number of pulses. The order of programming V1 and V0 can be reversed as desired. This method of programming mulit-level cells maintains at least 85% of the data margin and greatly reduces the programming time.

Figure 9:
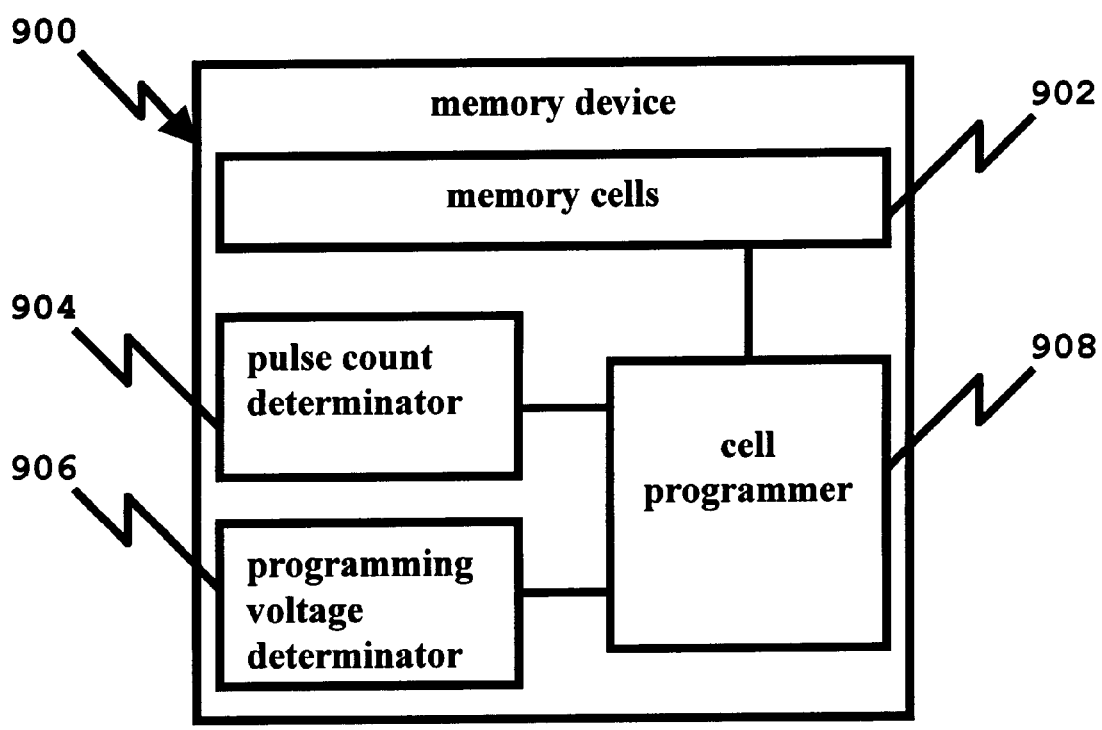
FIG. 9 is a diagram of a memory device.

FIG. 9, is a diagram of an embodiment of a memory 900 with memory cells 902, a pulse count determinator 904, a programming voltage determinator 906, and a cell programmer 908. The memory cells 902 preferably include a plurality of pages of multi-bit cells. The pulse count determinator 904 determines the pulse counts required for programming the cells. The programming voltage determinator 906 determines the programming voltages required to program the cells. The cell programmer 908 can include an erase circuit and a cell programmer circuit. The erase circuit erases a particular cell, or preferably erases a page of cells.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A method of programming a plurality of multi-level memory cells within a programming time target, the multi-level memory cells having at least first, second, third and fourth programming levels, the fourth programming level being the erase state, the first programming level being the programming level furthest from the fourth programming level, the second and third programming levels being within the first and fourth programming levels, comprising:

erasing the plurality of multi-level memory cells; programming a first group of multi-level memory cells with the first programming level with a first programming pulse count, a first pulse width, and a first programming voltage;

programming a second group of multi-level memory cells with the second programming level with a second programming pulse count, a second pulse, width and a second programming voltage; and programming a third group of multi-level memory cells with the third programming level with a third programming pulse count, a third pulse width, and a third programming voltage.

2. The method of claim 1, wherein the plurality of multi-level memory cells comprises a page of multi-level NAND memory cells.

3. The method of claim 1, wherein the cells are multi-level flash memory cells.

4. The method of claim 1, wherein the first, second, third, and fourth programming levels are approximately 2.0V, 1.0V, 0.0V, and −2.5V respectively.

5. The method of claim 1, wherein the second pulse width is 5 to 10 microseconds.

6. The method of claim 1, wherein the first pulse width is 3 to 6 microseconds.

7. The method of claim 1, wherein the second programming voltage is 17 to 19 volts.

8. The method of claim 1, wherein the third programming voltage is 18 to 20 volts.

9. The method of claim 1, wherein the first programming pulse count is the minimum pulse count required to program the cell.

10. The method of claim 1, wherein the second programming pulse count is selected to maintain at least 85% of the maximum programming margin.

11. The method of claim 10, wherein the third programming pulse count is substantially the same as the second programming pulse count.

12. The method of claim 10, wherein the second pulse width is selected such that the combination of the programming times for the first, second, and third programming levels is within the programming time target.

13. The method of claim 12, wherein the third pulse width is substantially the same as the second pulse width.

14. The method of claim 13, wherein the third programming voltage programs the cell to the third programming level with the third programming pulse count of the third pulse width, the third programming voltage being an offset of the second programming voltage.

15. A memory device, comprising:

(a) a plurality of memory cells capable of being programmed with a first, second, third, and fourth voltage levels, each voltage level corresponding to a plurality of bits of information, the plurality of memory cells comprising a first, second, third, and fourth group of cells;

(b) a pulse count determination means for determining first, second, and third pulse counts for programming the first, second, and third group of cells, respectively;

(c) a program voltage determination means for determining first, second, and third program voltages for programming the first, second, and third group of cells, respectively; and (d) a cell programming means for programming each of the plurality of cells in the plurality of memory cells with the first, second, third, and four voltage levels, the cell programming means programming the plurality of memory cells with the fourth voltage level, then programming the first group of cells to the first voltage level using the first program voltage and the first pulse count, then programming the second group of cells to the second voltage level using the second program voltage and the second pulse count, then programming the third group of cells to the third voltage level using the third program voltage and the third pulse count.

16. A memory device, comprising:

(a) a plurality of memory cells capable of being programmed with a first, second, third, and fourth voltage levels, each voltage level corresponding to a plurality of bits of information, the plurality of memory cells including a first, second, third, and fourth group of cells;

(b) a pulse count determinator capable of determining a first, second, and third pulse counts for programming the first, second, and third group of cells, respectively;

(c) a program voltage determinator being capable of determining a first, second, and third program voltages for programming the first, second, and third group of cells, respectively; and (d) a cell programmer capable of programming each of the plurality of cells in the plurality of memory cells with the first, second, third, and four voltage levels, the cell programmer programming the plurality of memory cells with the fourth voltage level, then programming the first group of cells to the first voltage level using the first program voltage and the first pulse count, then programming the second group of cells to the second voltage level using the second program voltage and the second pulse count, then programming the third group of cells to the third voltage level using the third program voltage and the third pulse count.

17. The memory device of claim 16, wherein the fourth voltage level is the erase voltage level.

18. The memory device of claim 16, wherein the cell programmer includes a cell erase circuit and a cell programming circuit, the cell erase circuit being capable of erasing one or more of the plurality of cells, the cell programming circuit being capable of programming one or more of the plurality of cells to the first, second, and third voltage levels.

19. The memory device of claim 16, wherein the second pulse width is selected such that the combination of the programming times for the first, second, and third programming levels is within the programming time target.

20. The memory device of claim 16, wherein the second programming pulse count is selected to maintain at least 85% of the maximum programming margin.

* * * * *